United States Patent
He et al.

(10) Patent No.: US 9,881,947 B2
(45) Date of Patent: Jan. 30, 2018

(54) ARRAY SUBSTRATE AND MANUFACTURING METHOD THEREOF, DISPLAY DEVICE

(71) Applicants: Boe Technology Group Co., Ltd., Beijing (CN); Beijing Boe Display Technology Co., Ltd., Beijing (CN)

(72) Inventors: Zongze He, Beijing (CN); Jianming Wang, Beijing (CN); Zhiming Meng, Beijing (CN); Weihao Hu, Beijing (CN)

(73) Assignees: BOE TECHNOLOGY GROUP CO., LTD., Beijing (CN); BEIJING BOE DISPLAY TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/905,385

(22) PCT Filed: Jul. 16, 2015

(86) PCT No.: PCT/CN2015/084192
§ 371 (c)(1),
(2) Date: Jan. 15, 2016

(87) PCT Pub. No.: WO2016/095513
PCT Pub. Date: Jun. 23, 2016

(65) Prior Publication Data
US 2016/0329363 A1 Nov. 10, 2016

(30) Foreign Application Priority Data
Dec. 16, 2014 (CN) .......................... 2014 1 0785115

(51) Int. Cl.
*H01L 27/14* (2006.01)
*H01L 27/13* (2006.01)
(Continued)

(52) U.S. Cl.
CPC ........ *H01L 27/13* (2013.01); *G02F 1/136286* (2013.01); *H01L 21/77* (2013.01);
(Continued)

(58) Field of Classification Search
None
See application file for complete search history.

(56) References Cited

U.S. PATENT DOCUMENTS 7,282,380 B2 * 10/2007 Maruyama .......... H01L 21/6835
257/E21.01
7,704,765 B2 * 4/2010 Maruyama .......... H01L 21/6835
257/E21.01
(Continued)

FOREIGN PATENT DOCUMENTS

CN 1753166 3/2006
CN 101095239 12/2007
(Continued)

OTHER PUBLICATIONS

English translation of CN102931199, 17 pgs, retrieved on Dec. 12, 2016 from Google Patents: https://patents.google.com/patent/CN102931199A/en.*
(Continued)

*Primary Examiner* — David E Graybill
(74) *Attorney, Agent, or Firm* — Calfee, Halter & Griswold LLP

(57) ABSTRACT

An array substrate and a manufacturing method thereof, comprising a base substrate, and a gate, a gate insulating layer, an active layer and a source/drain arranged on the base substrate, the array substrate further comprising an antenna for receiving and/or transmitting wireless signals, the antenna being arranged on the base substrate. By arranging the antenna on the base substrate of the array substrate, the antenna is integrated directly in the display panel. Thus, not
(Continued)

only the area of the PCB circuit board in the display device can be reduced, but also the spare area in the array substrate can be utilized sufficiently, thereby improving the integration level of the display device and reducing the total volume of the display device.

10 Claims, 3 Drawing Sheets

(51) Int. Cl.
*H01L 21/77* (2017.01)
*H01L 27/12* (2006.01)
*H01L 23/522* (2006.01)
*H01L 23/64* (2006.01)
*G02F 1/1362* (2006.01)
*G02F 1/1333* (2006.01)

(52) U.S. Cl.
CPC ........ *H01L 23/5227* (2013.01); *H01L 23/645* (2013.01); *H01L 27/124* (2013.01); *H01L 27/1262* (2013.01); *G02F 2001/133388* (2013.01); *H01L 2021/775* (2013.01)

(56) References Cited

U.S. PATENT DOCUMENTS

| | | | | |
|---|---|---|---|---|
| 7,714,633 B2 * | 5/2010 | Kato | ............... | G06K 19/07735 257/360 |
| 7,732,263 B2 * | 6/2010 | Yamazaki | ............. | G11C 17/12 257/E21.413 |
| 7,994,617 B2 * | 8/2011 | Arai | ..................... | G06K 19/025 257/679 |
| 8,030,745 B2 * | 10/2011 | Yamazaki | .......... | G06K 19/0728 257/53 |
| 8,054,121 B2 * | 11/2011 | Kato | ............... | G06K 19/07735 327/309 |
| 8,159,043 B2 * | 4/2012 | Yamazaki | ........ | G06K 19/07749 257/531 |
| 8,384,081 B2 * | 2/2013 | Yamazaki | ............. | G11C 17/12 257/57 |
| 8,456,601 B2 * | 6/2013 | Lim | .................. | G02F 1/134363 349/141 |
| 8,497,505 B2 * | 7/2013 | Kim | .................... | H01L 27/0705 257/57 |
| 8,546,912 B2 * | 10/2013 | Yamazaki | ........ | G06K 19/07749 257/531 |
| 8,575,740 B2 * | 11/2013 | Arai | ..................... | G06K 19/025 257/679 |
| 8,835,907 B2 * | 9/2014 | Moriya | .................. | H01L 21/56 257/4 |
| 9,449,999 B2 * | 9/2016 | Yamazaki | .......... | G06K 19/0728 |
| 2005/0214984 A1 * | 9/2005 | Maruyama | .......... | H01L 21/6835 438/149 |
| 2006/0094164 A1 | 5/2006 | Furuki | | |
| 2006/0141474 A1 * | 6/2006 | Miyahara | ............. | C12Q 1/6837 435/6.11 |
| 2007/0120681 A1 * | 5/2007 | Yamazaki | ........ | G06K 19/07749 340/572.8 |
| 2007/0159335 A1 * | 7/2007 | Arai | ..................... | G06K 19/025 340/572.8 |
| 2007/0176234 A1 * | 8/2007 | Yamazaki | ............. | G11C 17/12 257/347 |
| 2007/0176622 A1 * | 8/2007 | Yamazaki | .......... | G06K 19/0728 257/679 |
| 2007/0272759 A1 * | 11/2007 | Kato | ................. | G06K 19/07735 235/492 |
| 2007/0292997 A1 * | 12/2007 | Maruyama | .......... | H01L 21/6835 438/166 |
| 2008/0122767 A1 * | 5/2008 | Lim | .................. | G02F 1/134363 345/87 |
| 2008/0231354 A1 * | 9/2008 | Koyama | ............. | H01L 27/1214 327/566 |
| 2008/0238533 A1 * | 10/2008 | Kato | ....................... | G11C 5/142 327/535 |
| 2010/0148845 A1 * | 6/2010 | Kato | ................. | G06K 19/07735 327/308 |
| 2010/0187317 A1 * | 7/2010 | Yamazaki | ............. | G11C 17/12 235/492 |
| 2011/0284974 A1 * | 11/2011 | Arai | ..................... | G06K 19/025 257/414 |
| 2012/0007096 A1 * | 1/2012 | Yamazaki | .......... | G06K 19/0728 257/72 |
| 2012/0043547 A1 * | 2/2012 | Kim | ..................... | H01L 27/0705 257/59 |
| 2012/0187457 A1 * | 7/2012 | Yamazaki | ........ | G06K 19/07749 257/252 |
| 2013/0009289 A1 * | 1/2013 | Arai | ..................... | G06K 19/025 257/664 |
| 2014/0125533 A1 * | 5/2014 | Shi | ......................... | H01Q 1/243 343/721 |

FOREIGN PATENT DOCUMENTS

| | | | | |
|---|---|---|---|---|
| CN | 101950748 | | 1/2011 | |
| CN | 102931199 | | 2/2013 | |
| CN | 102931199 A | * | 2/2013 | ............. H01Q 1/243 |
| CN | 204230241 | | 3/2015 | |
| CN | 204230241 U | | 3/2015 | |

OTHER PUBLICATIONS

International Search Report and Written Opinion from PCT/CN15/84192 dated Oct. 23, 2015.
Office action from Chinese Application No. 201410785115.6 dated Nov. 11, 2016.
Second Office Action for Chinese Patent Application No. 201410785115.6 dated May 2, 2017.
Third Office Action from Chinese Application No. 201410785115.6 dated Aug. 10, 2017.

* cited by examiner

ARRAY SUBSTRATE AND MANUFACTURING METHOD THEREOF, DISPLAY DEVICE

RELATED APPLICATIONS

The present application is the U.S. national phase entry of PCT/CN2015/084192, with an international filing date of Jul. 16, 2015, which claims the benefit of Chinese Patent Application No. 201410785115.6, filed on Dec. 16, 2014, the entire disclosures of which are incorporated herein by reference.

FILED OF THE INVENTION

The present invention relates to the field of display, particularly to an array substrate and manufacturing method thereof, and a display device.

BACKGROUND OF THE INVENTION

With development of the microelectronic technology, various sensors can be integrated through the microelectronic technique, in which the integrated devices represented by silicon based micro electro mechanical technology are particularly prominent. However, the conventional silicon based device is still an independent physical module in system level design, which may impact on improving integration level of the whole system and reducing the volume.

In the current microelectronic field, following Moore's Law, feature sizes of devices has entered the era of 14 nanometer. However, the integration of some passive devices is not as simple as active devices. The antenna as a passive device is an indispensible component in the electronic circuit field, for a wireless communication terminal, the antenna is generally integrated on the silicon based substrate of the PCB circuit board. However, since the semiconductor property of the silicon based substrate may result in substrate loss when the antenna works, and the antenna occupies a relatively large area of the silicon based substrate, development of a wireless communication terminal that is light and thin is limited by the use of the antenna on the silicon based substrate to some extent.

SUMMARY OF THE INVENTION (I) Technical Problem to be Solved

The technical problem to be solved by the present invention is to provide an array substrate and a manufacturing method thereof, and a display device, which can reduce the volume of the display device.

(II) Technical Solution

In order to solve the above technical problem, according to an aspect of the present invention, an array substrate is provided, comprising: a base substrate; and a gate, a gate insulating layer, an active layer and a source/drain arranged on the base substrate. The array substrate further comprises an antenna for receiving and/or transmitting wireless signals, the antenna being arranged on the base substrate.

Further, the antenna and the gate are arranged in a same layer.

Further, the array substrate further comprises a first insulating layer located on the antenna and a signal line located on the first insulating layer, a via hole is arranged in the first insulating layer and the signal line is connected with the antenna through the via hole.

Further, the first insulating layer and the gate insulating layer are arranged in a same layer, and the signal line and the source/drain are arranged in a same layer.

Further, a connecting layer is arranged in the via hole, and the signal line is connected with the antenna through the connecting layer.

Further, the array substrate further comprises a buffer metal layer arranged between the active layer and the source/drain, with the connecting layer and the buffer metal layer arranged in a same layer.

Further, the gate, the gate insulating layer, the active layer and the source/drain are located in a display area of the base substrate, and the antenna is located in a non-display area of the base substrate.

Further, the antenna has a spiral shape.

In order to solve the above technical problem, according to another aspect of the present invention, a display device is further provided, comprising the above array substrate.

In order to solve the above technical problem, according to a further aspect of the present disclosure, a manufacturing method of an array substrate is provided, comprising: forming a gate, a gate insulating layer, an active layer and a source/drain on a base substrate, with the method further comprising forming an antenna for receiving and/or transmitting wireless signals on the base substrate.

Further, forming an antenna on the base substrate comprises:
 forming a first metal film on the base substrate;
 patterning the first metal film, so as to form the gate on a display area of the base substrate and form the antenna on a non-display area of the base substrate.

Further, after forming the antenna on the base substrate, the method further comprises:
 forming a first insulating layer on the antenna;
 forming a via hole in the first insulating layer;
 forming a second metal film; and patterning the second metal film so as to form a signal line, the signal line being connected with the antenna through the via hole.

Further, the first insulating layer and the gate insulating layer are formed in a same layer, the second metal film is further used for forming the source/drain.

Further, after forming the via hole in the first insulating layer and before forming the second metal film, the method further comprises: forming the active layer on the gate insulating layer; forming a third metal film; and patterning the third metal film, so as to form a buffer metal layer on a source/drain area of the active layer and form a connecting layer in the via hole.

(III) Beneficial Effect

The present invention, by arranging the antenna on the base substrate of the array substrate, can integrate the antenna in the display panel directly. Thus, not only can the area of the PCB circuit board in the display device be reduced, but also the spare area in the array substrate can be utilized sufficiently, thereby improving the integration level of the display device and reducing the total volume of the display device. In addition, the antenna can be prepared on a glass substrate. Since the insulating property of the glass substrate enables the substrate loss of the antenna to be very small, the quality of the antenna can be improved.

DETAILED DESCRIPTION OF THE INVENTION

Specific embodiments of the present invention will be described in greater detail with reference to the drawings and the embodiments. The following embodiments are for explanatory purposes only and not for limiting the scope of the present invention.

An embodiment of the present invention provides an array substrate, the array substrate comprising a base substrate, and a gate, a gate insulating layer, an active layer and a source/drain arranged on the base substrate, the array substrate further comprising an antenna for receiving and/or transmitting wireless signals, with the antenna arranged on the base substrate.

Figure 1:
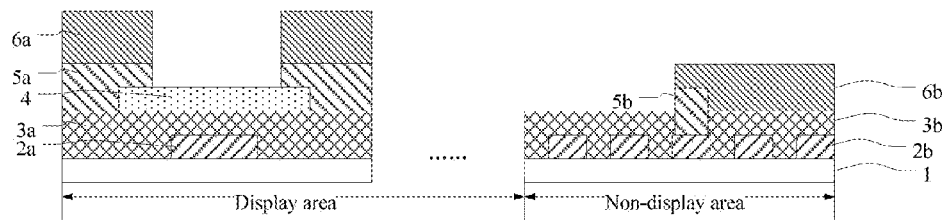
FIG. 1 is a schematic view of an array substrate provided by an embodiment of the present invention.

FIG. 1 is a schematic view of an array substrate provided by an embodiment of the present invention. The array substrate comprises a base substrate 1, a gate 2a, a gate insulating layer 3a, an active layer 4 and a source/drain 6a are arranged successively on a display area of the base substrate 1. Optionally, a buffer metal layer 5a can also be arranged between the active layer 4 and the source/drain 6a. An antenna 2b, a first insulating layer 3b and a signal line 6b are arranged successively on a non-display area of the base substrate 1. The signal line 6b is connected with the antenna 2b through a via hole in a first insulating layer 3b.

Figure 2:
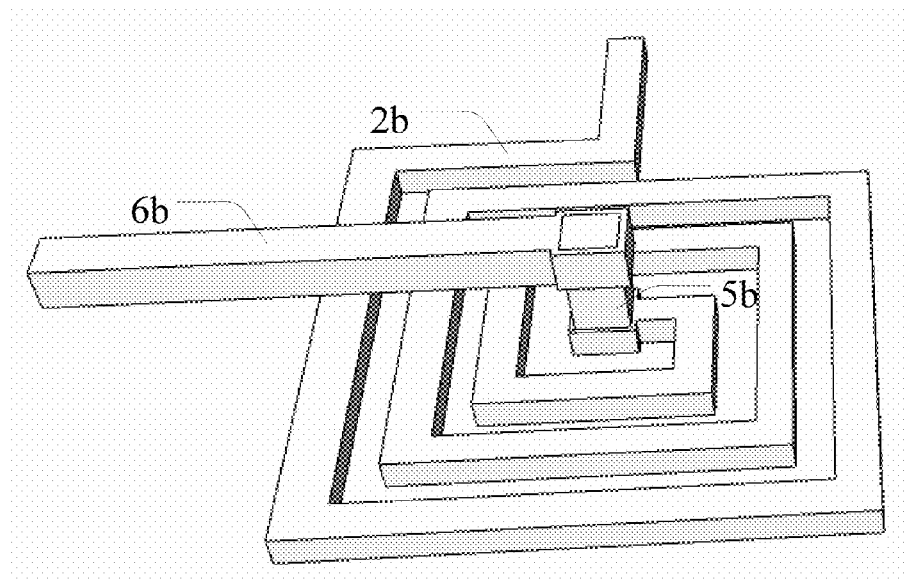
FIG. 2 is a structural schematic view of an antenna provided by an embodiment of the present invention.

The above base substrate 1 can be a glass substrate, and the antenna can have any shape. Further, in order to improve space utilization rate and enhance signal receiving effect of the antenna, the antenna 2b can have a spiral shape as shown in FIG. 2.

By arranging the antenna on the base substrate of the array substrate, the array substrate provided by the embodiment can integrate the antenna in the display panel directly. Thus, not only the area of the PCB circuit board in the display device may be reduced, but also the spare area in the array substrate may be utilized sufficiently, thereby improving the integration level of the display device and reducing the total volume of the display device. In addition, the antenna can be prepared on a glass substrate. Since the insulating property of the glass substrate enables the substrate loss of the antenna to be very small, the quality of the antenna can be improved.

Further, in the above embodiment, the antenna and the gate can be arranged in the same layer, i.e., the antenna 2b and the gate 2a are of the same material and are formed in one patterning process.

Further, the above embodiment may include the first insulating layer and the gate insulating layer arranged in the same layer, and the signal line and the source/drain arranged in the same layer (i.e., the gate insulating layer 3a and the first insulating layer 3b use the same material and are formed in one patterning process, and the signal line 6b and the source/drain 6a use the same material and are formed in one patterning process).

Further, in order to improve adhesion and electrical conductivity between the signal line 6b and the antenna 2b, a connecting layer 5b is further arranged in the via hole of the first insulating layer 3b, and the signal line 6b is connected with the antenna 2b through the connecting layer 5b. Further, in the event that the buffer metal layer 5a is arranged between the active layer 4 and the source/drain 6a, the connecting layer 5b and the buffer metal layer 5a can be arranged in the same layer, i.e., the connecting layer 5b and the buffer metal layer 5a use the same material and are formed in one patterning process.

In addition, an embodiment of the present invention further provides a display device, comprising the above array substrate. The display device provided by the embodiment of the present invention may be any product or component with display function, such as a notebook computer display screen, a liquid crystal display, a liquid crystal television, a digital photo frame, a mobile phone, a panel computer etc.

An embodiment of the present invention further provides a manufacturing method of an array substrate, the manufacturing method of the array substrate comprising forming a gate, a gate insulating layer, an active layer and a source/drain on an base substrate, with the method further comprising forming an antenna for receiving and/or transmitting wireless signals on the base substrate.

The above base substrate may be a glass substrate, and the forming of the antenna can be achieved by forming a patterned metal layer on the base substrate.

Figure 3:
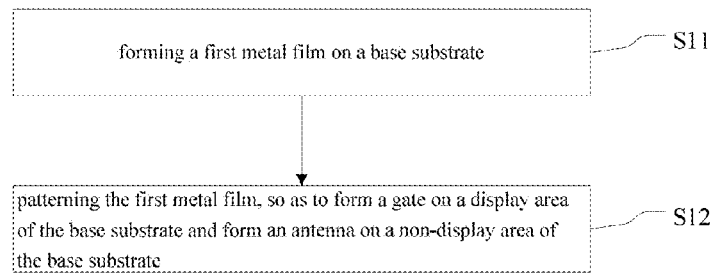
FIG. 3 is a flow chart of forming an antenna in an array substrate provided by an embodiment of the present invention.

Specifically, referring to FIG. 3, FIG. 3 is a flow chart of forming an antenna on the array substrate provided by an embodiment of the present invention, comprising:

S11: forming a first metal film on the base substrate;

S12: patterning the first metal film, so as to form the gate on a display area of the base substrate and form the antenna on a non-display area of the base substrate.

For the display device, since the spare area on the array substrate therein is much larger than the silicon based integrated circuit, the above antenna can be formed in the spare area other than the display area in the array substrate. Thus, not only the manufacturing costs can be reduced, but also the product manufactured can be lighter and thinner, moreover, impact on display of the array substrate can also be avoided.

The manufacturing method of the array substrate provided by the embodiment of the present invention, by forming the antenna on the base substrate of the array substrate, can integrate the antenna in the display panel directly. Thus, not only the area of the PCB circuit board in the display device can be reduced, but also the spare area in the array substrate can be utilized sufficiently, thereby improving the integration level of the display device and reducing the total volume of the display device. In addition, the antenna can be prepared on a glass substrate. Since the insulating property of the glass substrate enables the substrate loss of the antenna to be very small, the quality of the antenna can be improved.

Figure 4:
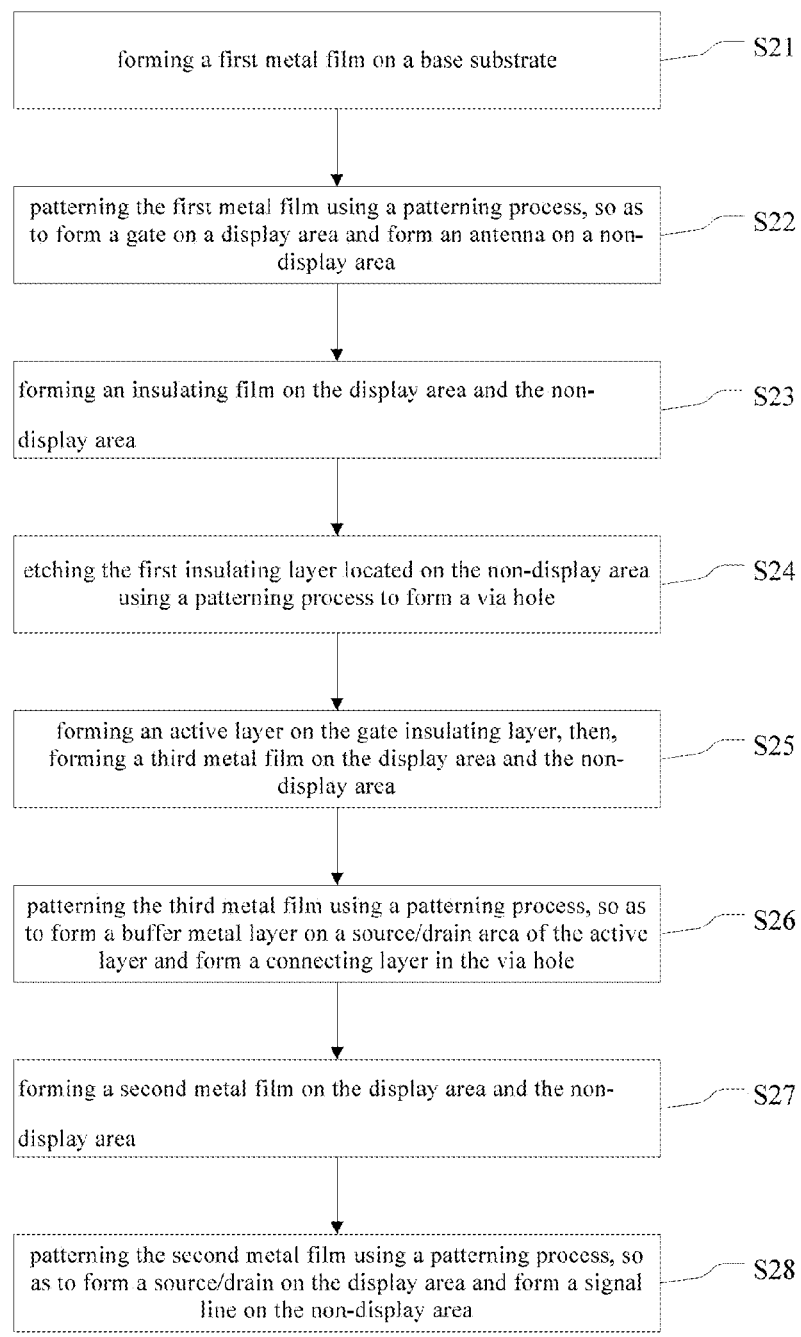
FIG. 4 is a flow chart of manufacturing an array substrate provided by an embodiment of the present invention.
Figure 5:
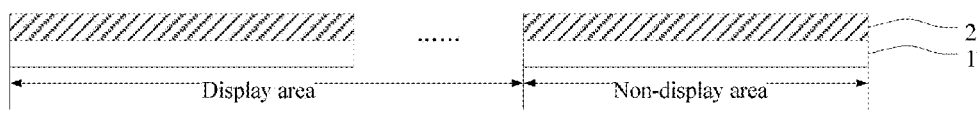
FIGS. 5-11 are schematic views of manufacturing an array substrate provided by an embodiment of the present invention.

Wherein, the above antenna can be formed simultaneously in the 4 mask or 5 mask process of manufacturing the array substrate. Thus, increasing patterning times in manufacturing the array substrate caused by manufacturing the antenna can be avoided, thereby reducing the manufacturing cost. Specifically, referring to FIG. 4, a flow chart of a method of manufacturing an array substrate is provided. The method includes the steps of:

S21: forming a first metal film on the base substrate. Wherein the first metal film is located on a display area of the base substrate and a non-display area outside the display area of the base substrate. For example, referring to FIG. 5, the first metal film 2 can be formed by depositing Cu material through vacuum sputtering on the cleaned transparent glass substrate 1.

Figure 6:
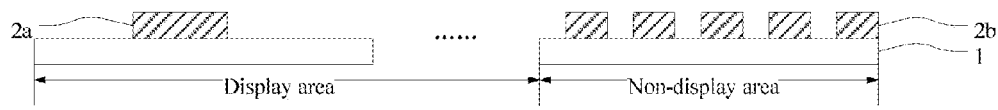

S22: patterning the first metal film using a patterning process, so as to form the gate on the display area and form the antenna on the non-display area. Further, the antenna can have a spiral shape, thereby being capable of improving the space utilization rate of the non-display area in the array substrate as much as possible. For example, referring to FIG. 6, a first mask can be used to form the gate 2a and the antenna 2b simultaneously through exposing, developing and etching.

Figure 7:
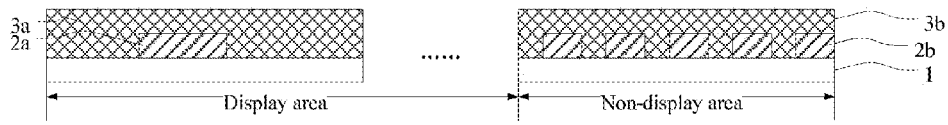

S23: forming an insulating film, the insulating film is not only located on the display area of the base substrate, but also located on its non-display area. The insulating film that is located on the non-display area and covers the antenna forms the first insulating layer, and the insulating film located on the display area forms the gate insulating layer. For example, referring to FIG. 7, the SiNx material can be deposited on the gate and the antenna using PECVD so as to form the insulating film, to obtain the first insulating layer 3b and the gate insulating layer 3a.

Figure 8:
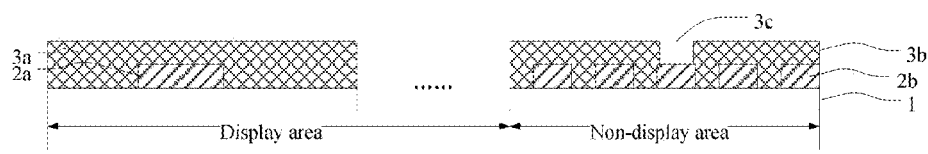

S24: etching the first insulating layer located in the non-display area using the patterning process, so as to form a via hole in the first insulating layer. For example, referring to FIG. 8, a negative photoresist and a second mask can be used to form a via hole 3c by exposing, developing and etching the first insulating layer 3b located on the non-display area, the position of the via hole can be located exactly above the antenna.

Figure 9:
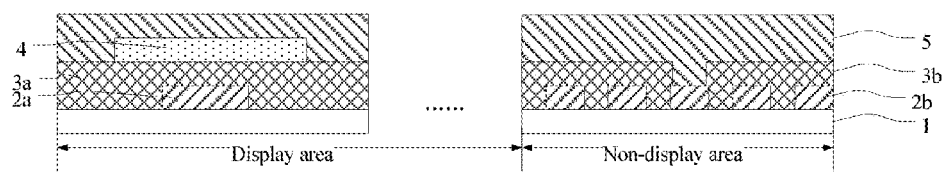

S25: forming an active layer on the gate insulating layer, then, forming a third metal film on the display area and the non-display area. The third metal film is used for improving adhesion and electrical conductivity between the two layer structures adjacent to it. For example, referring to FIG. 9, after the active layer 4 is formed, a third metal film 5 is formed using the method of ion sputtering or evaporation, the third metal film can use Cr material, and can also use Mo, ALNd, MoW, Ti, Ta or Cu material.

Figure 10:
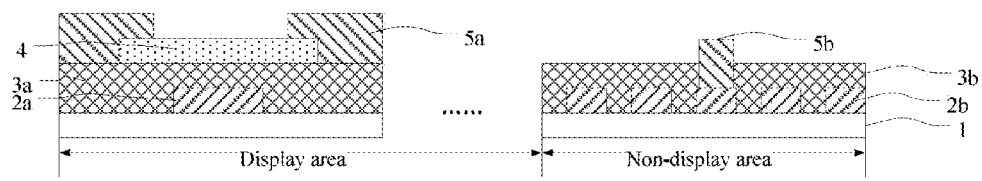

S26: patterning the third metal film using a patterning process, so as to form a buffer metal layer on the source/drain area of the active layer and form a connecting layer in the via hole. Through the above buffer metal layer, the adhesion and electrical conductivity between the active layer and the source/drain can be improved. Moreover, the adhesion and electrical conductivity between the antenna and the signal line can be improved through the connecting layer. For example, referring to FIG. 10, a positive photoresist and a third mask can be used to form the buffer metal layer 5a on the display area and form the connecting layer 5b in the via hole 3c of the non-display area through exposing, developing and etching.

Figure 11:
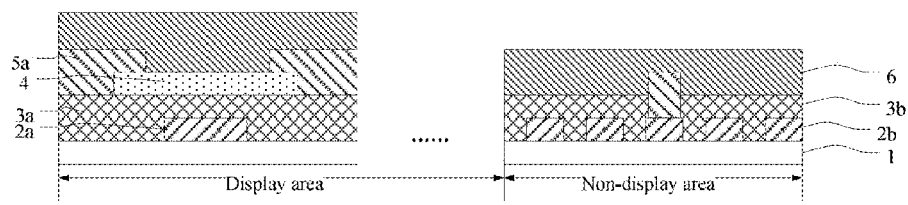

S27: forming a second metal film on the display area and the non-display area, the second metal film located on the non-display area is connected with the antenna through the connecting layer. For example, referring to FIG. 11, the second metal film 6 can be formed using evaporation or ion sputtering.

S28: patterning the second metal film using a patterning process, so as to form the source/drain on the display area and form the signal line on the non-display area. For example, a fourth mask can be used to form the source/drain on the display area and form the signal line in the non-display area through exposing, developing and etching, so as to obtain the structure as shown in FIG. 1.

The above embodiments are only used for explaining the present invention rather than limiting the present invention. The ordinary skilled person in the related technical field can also make various modifications and variants without departing from the spirit and scope of the present invention. Therefore, all the equivalent technical solutions also belong to the scope of the present invention, and the patent protection scope of the present invention should be defined by claims.

The invention claimed is:

1. An array substrate, comprising a base substrate; and a gate,
   a gate insulating layer, an active layer and a source/drain arranged on the base substrate,
   wherein the array substrate further comprises an antenna for receiving and/or transmitting wireless signals, the antenna arranged on the base substrate, and
   wherein the array substrate further comprises a first insulating layer located on the antenna and a signal line arranged on a top surface of the first insulating layer, and a bottom surface of the signal line is in direct contact with the top surface of the first insulating layer,
   wherein a via hole is arranged in the first insulating layer, and a connecting layer is arranged in the via hole,
   wherein the signal line is connected with the antenna through the connecting layer, and
   wherein the antenna has a spiral shape, and a bottom surface of the connecting layer is in direct contact with a central portion of the antenna.

2. The array substrate according to claim 1, wherein the antenna and the gate are of the same material and are formed in one patterning process.

3. The array substrate according to claim 1, wherein the first insulating layer and the gate insulating layer are of the same material and are formed in one patterning process, and the signal line and the source/drain are of the same material and are formed in one patterning process.

4. The array substrate according to claim 1, further comprising a buffer metal layer arranged between the active layer and the source/drain, wherein the connecting layer and the buffer metal layer are of the same material and are formed in one patterning process.

5. The array substrate according to claim 1, wherein the gate, the gate insulating layer, the active layer and the source/drain are located in a display area of the base substrate, and the antenna is located in a non-display area of the base substrate.

6. A display device, comprising the array substrate according to claim 1.

7. The display device according to claim 6, wherein the antenna and the gate are of the same material and are formed in one patterning process.

8. The display device according to claim 6, wherein the first insulating layer and the gate insulating layer are of the same material and are formed in one patterning process, and the signal line and the source/drain are of the same material and are formed in one patterning process.

9. The display device according to claim 6, wherein the array substrate further comprises a buffer metal layer arranged between the active layer and the source/drain, and wherein the connecting layer and the buffer metal layer are of the same material and are formed in one patterning process.

10. The display device according to claim 6, wherein the gate, the gate insulating layer, the active layer and the source/drain are located in a display area of the base substrate, and the antenna is located in a non-display area of the base substrate.

* * * * *